US007372098B2

(12) United States Patent
Forbes

(10) Patent No.: US 7,372,098 B2
(45) Date of Patent: May 13, 2008

(54) LOW POWER FLASH MEMORY DEVICES

(75) Inventor: Leonard Forbes, Corvalis, OR (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 11/154,462

(22) Filed: Jun. 16, 2005

(65) Prior Publication Data
US 2006/0284235 A1 Dec. 21, 2006

(51) Int. Cl.
H01L 29/788 (2006.01)
H01L 29/76 (2006.01)
H01L 29/94 (2006.01)
H01L 31/00 (2006.01)

(52) U.S. Cl. ............... 257/316; 257/378; 257/E29.129; 257/E29.3; 257/E21.422; 257/E21.68

(58) Field of Classification Search ................. 257/316, 257/378, E29.129, 4, E29.3, E21.422, E21.68
See application file for complete search history.

(56) References Cited

U.S. PATENT DOCUMENTS

| 3,893,151 | A | * | 7/1975 | Bosselaar et al. ............ 257/318 |
| 5,867,425 | A | * | 2/1999 | Wong ..................... 365/185.08 |
| 5,896,315 | A | * | 4/1999 | Wong ..................... 365/185.01 |
| 5,926,418 | A | * | 7/1999 | Wong ..................... 365/185.28 |
| 5,940,324 | A | * | 8/1999 | Chi et al. ............... 365/185.27 |
| 6,060,742 | A | * | 5/2000 | Chi et al. ..................... 257/316 |
| 6,091,635 | A | * | 7/2000 | Chi et al. ............... 365/185.18 |
| 6,160,286 | A | * | 12/2000 | Chi ............................. 257/315 |
| 6,252,799 | B1 | * | 6/2001 | Liu et al. ................ 365/185.08 |
| 6,326,265 | B1 | * | 12/2001 | Liu et al. ..................... 438/257 |
| 6,586,797 | B2 | | 7/2003 | Forbes et al. |
| 6,624,026 | B1 | * | 9/2003 | Liu et al. ..................... 438/264 |
| 6,721,204 | B1 | * | 4/2004 | Yeh et al. ................ 365/185.24 |
| 6,734,490 | B2 | * | 5/2004 | Esseni et al. ................ 257/315 |
| 6,778,441 | B2 | * | 8/2004 | Forbes et al. ........... 365/185.26 |
| 6,794,255 | B1 | | 9/2004 | Forbes et al. |
| 6,980,471 | B1 | * | 12/2005 | Samachisa ............. 365/185.02 |
| 7,045,430 | B2 | | 5/2006 | Ahn et al. |
| 7,125,772 | B2 | * | 10/2006 | Wong ......................... 438/262 |
| 7,157,769 | B2 | | 1/2007 | Forbes |
| 7,160,577 | B2 | | 1/2007 | Ahn et al. |
| 7,198,999 | B2 | | 4/2007 | Forbes et al. |
| 2002/0027804 | A1 | * | 3/2002 | Wong ..................... 365/185.05 |
| 2002/0110033 | A1 | * | 8/2002 | Forbes ..................... 365/225.7 |
| 2003/0048666 | A1 | | 3/2003 | Eldridge et al. |
| 2003/0049900 | A1 | | 3/2003 | Forbes et al. |

(Continued)

OTHER PUBLICATIONS

Bude, J. D., et al., "EEPROM/Flash Sub 3.0V Drain-Source Bias Hot Carrier Writing", *International Electron Devices Meeting, Technical Digest*, (Dec. 1995), 989-991.

(Continued)

*Primary Examiner*—Ngân V. Ngô
(74) *Attorney, Agent, or Firm*—Schwegman, Lundberg & Woessner, P.A.

(57) ABSTRACT

A buried bipolar junction is provided in a floating gate transistor flash memory device. During a write operation electrons are injected into a surface depletion region of the memory cell transistors. These electrons are accelerated in a vertical electric field and injected over a barrier to a floating gate of the cells.

23 Claims, 3 Drawing Sheets

U.S. PATENT DOCUMENTS

| | | | |
|---|---|---|---|
| 2004/0061168 A1* | 4/2004 | Cappelletti et al. | 257/315 |
| 2004/0114433 A1* | 6/2004 | Forbes | 365/185.18 |
| 2005/0194633 A1* | 9/2005 | Mori | 257/324 |
| 2005/0277243 A1 | 12/2005 | Forbes | |
| 2006/0139998 A1* | 6/2006 | Samachisa | 365/185.03 |
| 2006/0140009 A1* | 6/2006 | Lojek | 365/185.28 |

OTHER PUBLICATIONS

Bude, J. D., et al., "Secondary Electron Flash—a High Performance, Low Power Flash Technology for 0.35 micrometer and Below", *International Electron Devices Meeting, Technical Digest*, Held in Washington, D.C., (Dec. 7-10, 1997), 279-282.

Han, K. M., et al., "Sequential substrate and channel hot electron injection to separate oxide and interface traps in n-MOSTs", *Solid-State Electronics*, vol. 38, No. 1, (1995), 105-113.

Mahapatra, S., et al., "Chisel Flash EEPROM—Part I: Performance and Scaling", *IEEE Transactions on Electron Devices*, vol. 49, No. 7, (Jul. 2002), 1296-1301.

Mahapatra, S., et al., "Chisel Flash EEPROM—Part II: Reliability", *IEEE Transactions on Electron Devices*, vol. 49, No. 7, (Jul. 2002), 1302-1307.

Neugroschel, Arnost, et al., "Direct-Current Measurements of Oxide and Interface Traps on Oxidized Silicon", *IEEE Transactions on Electron Devices*, vol. 42, No. 9, (1995), 1657-1662.

Nishida, Toshikazu, "BiMOS and SMOSC structures for MOS parameter measurement", *Solid-State Electronics*, vol. 35, No. 3, (Mar. 1992), 357-369.

Sonoda, Ken'Ichiro, et al., "Compact Modeling of a Flash Memory Cell Including Substrate-Bias-Dependent Hot-Electron Gate Current", *IEEE Transactions on Electron Devices*, vol. 51, No. 10, (Oct. 2004), 1726-1730.

* cited by examiner

LOW POWER FLASH MEMORY DEVICES

FIELD OF THE INVENTION

The present invention relates to non-volatile memory devices, and more particularly to flash memory devices.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two primary forms: NOR flash and NAND flash. The names refer to the type of logic used in the storage cell array. Further, flash memory stores information in an array of transistors, called "cells," each of which traditionally stores one or more bits of information.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current is sensed and translated into 1's and 0's, reproducing the stored data.

Programming efficiency in flash memory, which is defined as a ratio of transistor gate current to programming drain-source current, is an important factor in determining power consumption in flash memories. The programming efficiency of flash memory cells, which utilize hot-electron injection, has been enhanced by applying a substrate bias.

Mechanisms of hot-electron injection in a floating gate transistor during a program operation are well known. The channel hot electron (CHE) component comes from energetic channel electrons which are accelerated by lateral electric fields along a channel of the floating gate transistor. A channel initiated secondary electron (CHISEL) component comes from energetic electrons which are generated by hole impact ionization in the substrate and accelerated by vertical electric fields.

A gate current (Ig) by hot-electron injection in program mode can be expressed as $Ig=I_{CHE}+I_{CHISEL}$. The $I_{CHE}$ component comes from energetic channel electrons which are accelerated by a channel electric field. The $I_{CHISEL}$ component comes from energetic electrons which are generated by hole impact ionization in the substrate and accelerated by a vertical electric field.

Known techniques for writing electrons onto the floating gate are still very inefficient. The drain current is on the order of a million times the gate current, or only about one in every millionth electrons flowing down the transistor channel is injected or results in an electron being injected on to the floating gate. This requires that a high drain current be used during writing and excessive power dissipation.

A BiMOS structure has been used to study the basic physical mechanisms of electron trapping in MOS gate oxides; see FIG. 1. The test structure 100 included a gate 110, a gate oxide layer 120, source 130 and drain 140. A buried bipolar emitter-base diode, layers 150 and 160, was used to inject electrons 170 which were accelerated in a surface depletion region and injected into the gate oxide 120. Excess electrons were collected by reverse biasing the drain and/or surface regions.

There is a need for an improved efficiency and reduced power consumption in programming a non-volatile memory cell.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term conductor is understood to include semiconductors, and the term insulator is defined to include any material that is less electrically conductive than the materials referred to as conductors.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice as is well known in the art.

Relative terms such as above, below, lateral and adjacent are not limited to a specific coordinate system. These terms are used to describe relative positions between components and are not intended to be limitations. As such, additional components can be positioned between components that are above, below, lateral and adjacent to each other. Further, the figures are provided to help facilitate an understanding of the detailed description, are not intended to be accurate in scale, and have been simplified.

The following detailed description is, therefore, not to be taken in a limiting sense, and the scope of the present invention is defined only by the appended claims, along with the full scope of equivalents to which such claims are entitled.

Figure 1:
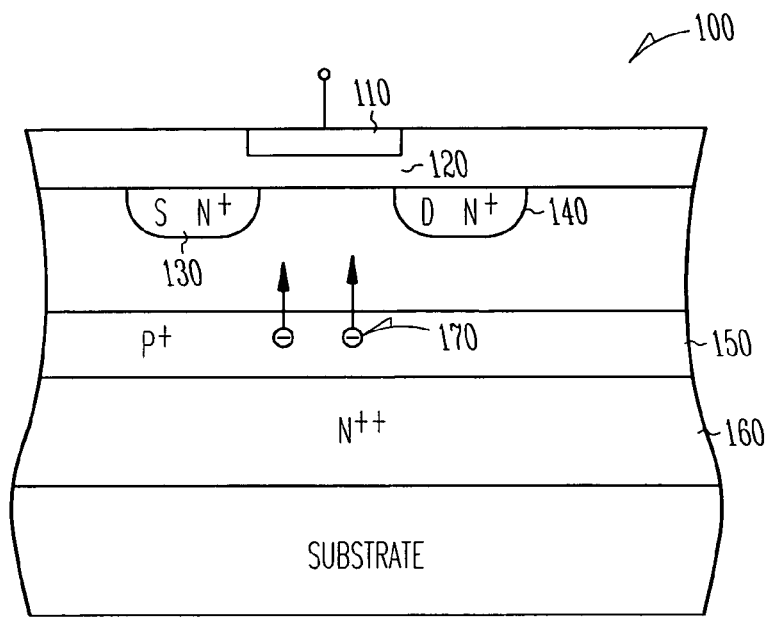
FIG. 1 illustrates a prior art test structure.
Figure 2:
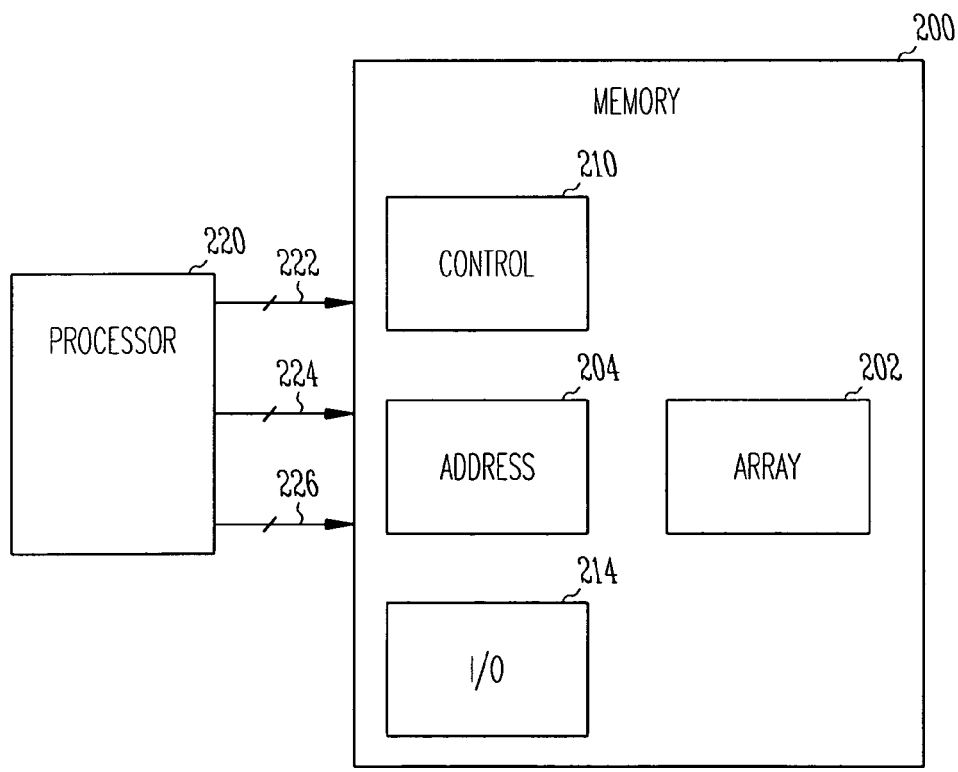
FIG. 2 is a block diagram of a memory according to one embodiment of the invention.

FIG. 2 is a simplified block diagram of an integrated circuit memory device 200 in accordance with an embodiment of the invention. The memory device 200 includes an array of non-volatile floating gate memory cells 202, address circuitry 204, control circuitry 210, and Input/Output (I/O) circuitry 214. The memory cells are also referred to as Flash memory cells because blocks of memory cells are typically erased concurrently, in a flash operation.

The memory device 200 can be coupled to a processor 220 or other memory controller for accessing the memory array 202. The memory device 200 coupled to a processor 220 forms part of an electronic system. Some examples of electronic systems include personal computers, peripheral devices, wireless devices, digital cameras, personal digital assistants (PDA's) and audio recorders.

The memory device 200 receives control signals across control lines 222 from the processor 220 to control access to the memory array 202 via control circuitry 210. Access to the memory array 202 is directed to one or more target memory cells in response to address signals received across address lines 224. Once the array is accessed in response to the control signals and the address signals, data is written to or read from the memory cells across data, DQ, lines 226.

It will be appreciated by those skilled in the art that additional circuitry and control signals can be provided, and that the memory device of FIG. 2 has been simplified to help focus on the invention. It will be understood that the above description of a memory device is intended to provide a general understanding of the memory and is not a complete description of all the elements and features of a typical memory device.

As described below, a buried emitter-base junction is provided in a non-volatile memory to inject electrons into a surface depletion region of a charge trapping memory device. These electrons are accelerated in a vertical electric field and injected over a barrier to a trapping region.

Figure 3:
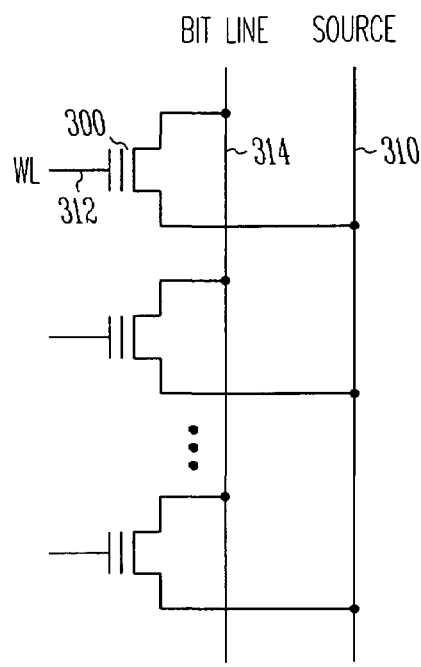
FIG. 3 is a schematic diagram of a prior art NOR Flash memory array.

As shown in FIG. 3, a simplified portion of a prior art NOR flash memory array is described. The memory array includes floating gate memory cells 300 coupled to source line 310, word lines 312 and bit line 314. The cells are arranged in a NOR configuration.

The prior art NOR flash cell is programmed (set to a specified data value) by conducting electrons from the source to the drain, and with a large voltage placed on the control gate (CG), a strong electric field drives electrons onto the floating gate (FG), a process called hot-electron injection. To erase (reset to all 1's, in preparation for reprogramming) a NOR flash cell, a large voltage differential is placed between the CG and source, which pulls the electrons off through Fowler-Nordheim tunneling, a quantum mechanical tunneling process. Most NOR flash memory components are divided into erase segments, usually called either blocks or sectors. All of the memory cells in a block are erased at the same time. NOR programming, however, can generally be performed one byte or word at a time.

In a read operation, a word line is activated to access a memory cell. Based upon a charge status of the floating gate, the memory cell may be activated. That is, if the floating gate is not charged, the cell has a lower threshold voltage and can be activated by a control gate voltage on the word line. When activated, the source line is coupled through the cell to the bit line. As such, the bit line voltage or current is used to read the memory cell. To program or erase a cell, the source line, bit line and word line voltages are controlled to either add charge to or remove charge from the floating gate cell, as explained above.

Figure 4:
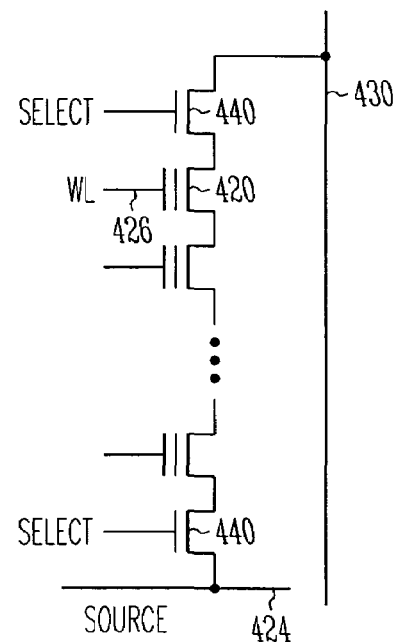
FIG. 4 is a schematic diagram of a prior art NAND Flash memory array.

FIG. 4 illustrates a simplified portion of a prior art NAND flash memory array. NAND Flash uses tunnel injection for writing and tunnel release for erasing. The NAND memory also includes floating gate memory cells 420 coupled to source line 424, word lines 426 and a bit line 430. Unlike the NOR memory arrangement, the NAND memory cells are coupled in a NAND configuration. That is, the cells are coupled in series between the bit line and source line. One or more bit line select transistors 440 are used to selectively isolate the cells from the bit and source lines.

In a read operation, a word line of a target (selected) memory cell is maintained at a low voltage level. All unselected cell word lines are coupled to a voltage sufficiently high to activate the unselected cells regardless of their floating gate charge. If the selected cell has an uncharged floating gate, it is activated. The bit line and source line are then coupled through the series of memory cells. If the selected cell has a charged floating gate, it will not activate. The bit line and source lines, therefore, are not coupled through the series of memory cells.

Figure 5:
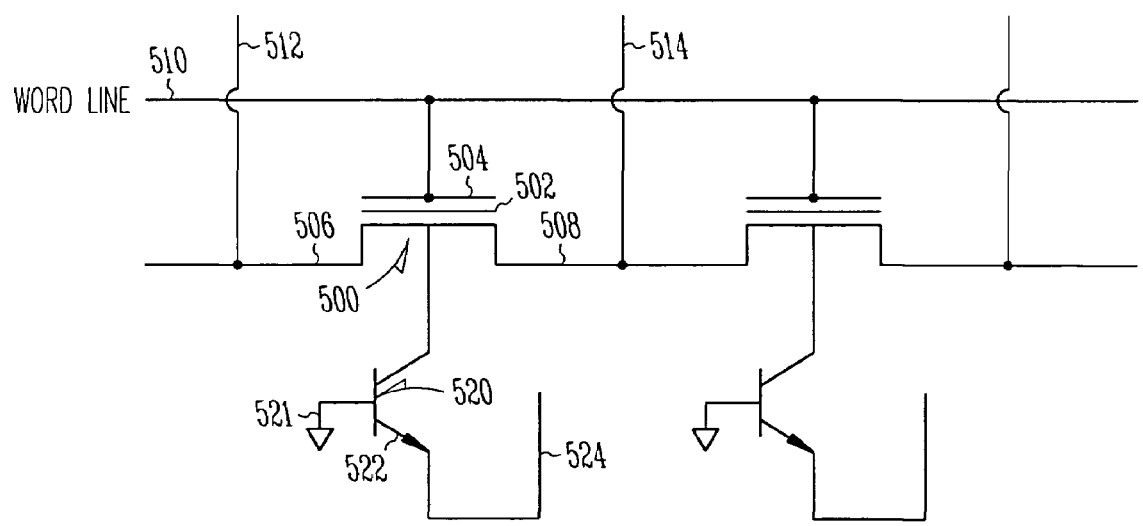
FIG. 5 is a simplified schematic diagram of a memory according to one embodiment of the invention.

FIG. 5 is a schematic diagram of a charge trapping floating gate memory cell 500 of one embodiment of the invention. The memory cell has a floating gate 502, control gate 504, source 506 and drain 508. As with a conventional flash memory, the control gate is coupled to a word line 510. The source and drain are generally coupled to write conductors 512 and 514.

In this embodiment, the memory cell is implemented in a virtual ground NOR type array as is commonly used with NROM or SONOS type flash memory devices. This implementation allows both the source 506 and drain 508 regions to be reverse biased during a write operation, as explained below. In this configuration no current flows between the source and drain during the write operation. During the write operation, the drain and source are used as collectors to prevent electrons from accumulating at the semiconductor surface.

The memory cell of FIG. 5 includes an NPN Bipolar transistor 520 function coupled to a body of the memory cell. A base 521 of the NPN transistor is coupled to ground and an emitter 522 is coupled to a write conductor 524. The schematic of FIG. 5 can be implemented in different integrated circuit fabrications. One example is illustrated in FIG. 6.

With an N-type buried emitter 522, during a write operation the base 521 is grounded, the emitter 522 is coupled to a negative voltage, and the control gate 504 is coupled to a positive voltage. The source 506 and drain 508 regions can be biased to a positive voltage. Actual voltage levels are dependant upon the physical construction and materials used in fabricating the transistor, such as the gate dielectric and floating gate. In general, the control gate is biased to a higher positive voltage level than the source and drain. Electrons are accelerated from emitter 522 to the floating gate 502 in a vertical electric field.

Read and erase are accomplished using conventional flash memory techniques. The data in the cell or charge stored on the floating gate is sensed by grounding the source and applying a control gate and drain bias. The conductivity of the memory cell transistor as a result of the charge state of the floating gate is determined. An erase is accomplished by applying a "large" negative control gate voltage and tunneling electrons off of the floating gate.

Figure 6:
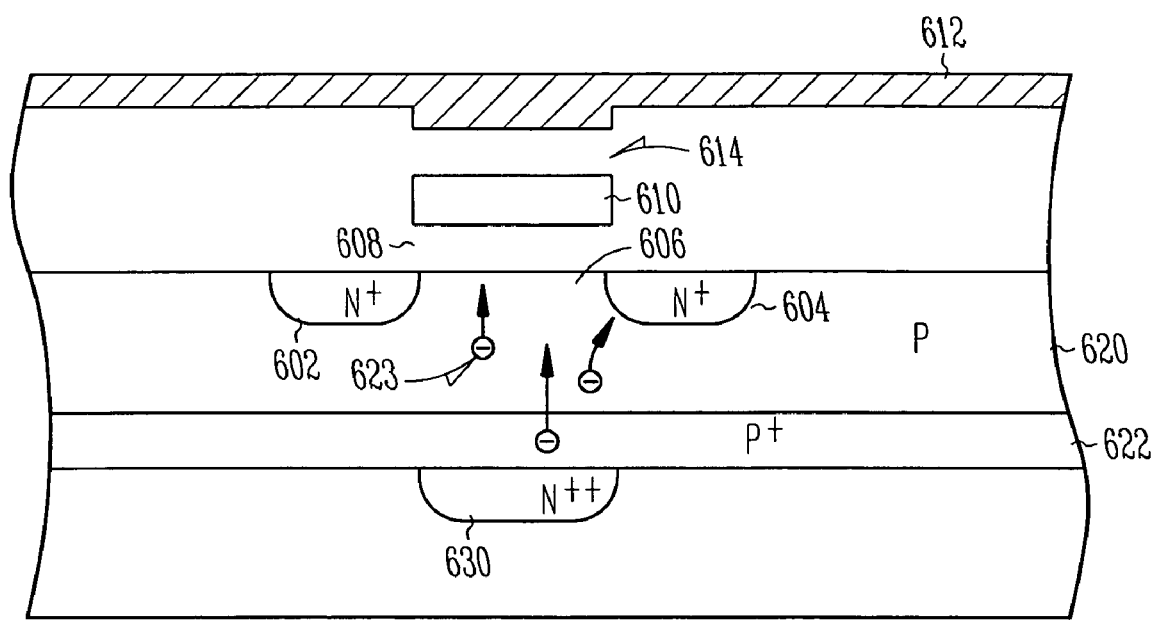
FIG. 6 is a cross-section view of a semiconductor memory according to one embodiment of the invention.

Referring to FIG. 6, a simplified cross-section of an example integrated circuit structure is described for allowing for a more efficient write operation in flash memories over conventional hot electron injection write techniques. The charge trapping cell in this embodiment is similar to a floating gate transistor. That is, the cell includes an n-type source region 602 and an n-type drain region 604 separated to form a channel region 606. A tunnel dielectric layer 608 separates the channel region from a floating gate 610. A control gate 612 is isolated from the floating gate by inter-gate dielectric 614.

The source 602 and drain regions 604 are diffused into a transistor body region 623, such as P-type substrate 620. A P+ region 622 can be located in the p-type substrate to provide a base connection, as explained below. A buried N++ region 630 is formed in the P substrate generally vertically below the channel region 606. The buried emitter region is a discrete region. That is it is not a complete layer under the memory array, such that less than all of the memory array cells can be selectively programmed at one time. For example, one bit or byte of memory cells can be programmed at one time.

The buried N++ region 630, substrate 620/622 and the source 602 (and drain 604) form an NPN transistor function. The buried emitter region 630 in one embodiment can be fabricated by using a known retrograde well doping process. In embodiments of the invention a bipolar junction is formed in the transistor body to form a vertical electric field during a write operation, such that electrons are accelerated in the vertical electric field and injected onto the floating gate 610.

During a memory cell program (write) operation, the buried emitter 630-base 622 junction injects electrons into the surface depleted channel region 606 of the memory device. That is, electrons injected across the p-type base region 620/622 are accelerated in a vertical electric field of the surface depleted channel region 606 and injected over the tunnel dielectric 608 barrier onto the floating gate 610.

The electrons need to acquire an energy greater than that of the tunnel dielectric barrier at the surface, for an oxide that is 3.2 eV, to overcome the barrier and be injected onto the floating gate. The required potential drop across the surface depletion region can be established by a positive control gate 612 voltage during the write operation. The current transfer ratio, or common base current gain, of the bipolar emitter-base does not need to be high. A relatively wide base region can be fabricated to help insure high yield in fabrication. The width of the base region is determined by the thickness of layer 622 and can be one micrometer or less in one embodiment.

During a program operation, some electrons will not gain enough energy to overcome the dielectric barrier to reach the floating gate. That is, many electrons may be scattered before they reach the dielectric 608-channel 606 interface and will lose energy. These scattered electrons can be collected by providing a reverse bias on the source 602 and drain 604 regions. The source and drain regions should be biased with a magnitude of an applied potential so that they can collect any extra electrons accumulating at the surface and those not overcoming the surface barrier.

Further reductions in write voltages can be achieved by using high-k (dielectric-constant) dielectrics with lower barriers for the gate tunnel dielectric 608. High-k dielectrics can be used for both the tunnel dielectric and the inter-gate dielectric 614 between the control gate and the floating gate.

For the present embodiments, high-k dielectrics are defined as those with a dielectric-constant greater than that of silicon nitride (i.e., >k=7). Although not limited to the following, some example high-k dielectrics are $BaSrTiO_3$ (k=300), $Ta_2O_5$ (k=26), $ZrO_2$ (k=25), $HfO_2$ (k=24.5) and $Al_2O_3$ (k=9).

A wide variety of different high-k dielectric materials can be realized using either atomic layer deposition, ALD, or evaporation. By varying composition ratios of these high-k dielectrics, the barriers and/or tunnel barriers can either be made lower between the silicon and the gate dielectric or between the floating gate and the gate insulating dielectric. Varying the composition $Al_2O_3$ and $LaAlO_3$ in the gate dielectric is one example of this technique.

The tunneling barrier of a conventional flash memory cell is a relatively large barrier and requires high applied electric fields for electron injection. Even with high applied fields, the erase times for conventional flash memory cells are long. The high fields additionally degrade device yield and contribute to various reliability problems including premature tunnel dielectric breakdown. Such problems stem from the fact that polysilicon floating gates in combination with an $SiO_2$ and/or $Si_3N_4$ dielectrics produce a large barrier height for charge injection and thus do not constitute a good combination of materials for flash memories.

As an example, in a conventional flash memory with a tunnel dielectric of silicon dioxide ($SiO_2$), electrons stored on a polysilicon floating gate encounter a large tunneling barrier of about 3.2 eV. The current during a memory cell erase operation is an exponential function of the barrier height and thickness. The large 3.2 eV tunneling barrier is the difference between the electron affinities of silicon (4.1 eV) and $SiO_2$ (0.9 eV). Silicon dioxide ($SiO_2$) is an insulator with a relative dielectric constant 3.9, energy gap of about 9 eV, and electron affinity of 0.9 eV. By comparison, the energy gap and electron affinity for semiconductor silicon are 1.1 eV and 4.1 eV, respectively.

Reductions in erase voltages can be achieved by not only using high-k dielectrics with lower barriers, but also using floating gate materials which reduce the barriers with the tunnel dielectric. Further, structured floating gate surfaces may also be used to increase electric fields at low voltages.

Embodiments of the present invention can implement different floating gate materials which exhibit a lower work function, e.g., SiC, SiOC, GaN, GaAlN, and microcrystalline GeC. Structured surfaces can also be used, which increase the localized electric fields. Further, amorphous SiC gate dielectrics with larger electron affinity can be used in embodiments to increase the tunneling probability and reduce erase time.

In yet further embodiments, a graded composition of silicon oxide or silicon oxycarbide can be used as a tunnel dielectric to reduce the tunneling barrier from the floating gate during erase of flash memory devices. A graded composition barrier between the control gate and floating gate can be implemented in an embodiment to provide different tunnel barriers.

The invention claimed is:

1. A floating gate transistor comprising:
    source and drain regions located in a transistor body region, the source and drain regions are laterally spaced apart to form a channel therebetween;
    a floating gate electrically isolated from and located vertically above the channel;
    a control gate isolated from and located vertically above the floating gate; and a bi-polar junction located in the transistor body comprising a base region having a doping level higher than a doping level of the transistor body and an oppositely doped emitter region disposed below the base region, to form a vertical electric field during a write operation in response to at least one of a negative bias applied to the emitter region and a reference bias applied to the base region, such that electrons are accelerated in the vertical electric field and injected onto the floating gate.

2. The floating gate transistor of claim 1 wherein the bi-polar junction comprises a buried implant region.

3. The floating gate transistor of claim 1 further comprising a bias conductor to selectively bias the bi-polar junction to form the vertical electric field.

4. The floating gate transistor of claim 1 wherein the floating gate is electrically isolated from the channel by a high-k dielectric.

5. The floating gate transistor of claim 1 wherein the floating gate comprises at least one of a material having a lower work function than polysilicon, SiC, SiOC, GaN, GaAlN, or microcrystalline GeC.

6. A floating gate transistor comprising:
  source and drain regions located in a body region of a semiconductor substrate, the source and drain regions are laterally spaced apart to form a channel therebetween, wherein the source and drain regions have a first doping type and the body region has a second oppositely doped type;
  a floating gate electrically isolated from and located vertically above the channel;
  a control gate isolated from and located vertically above the floating gate; and
  a base region having the second oppositely doped type and a higher doping level than the body region, a buried emitter region vertically located below the base, channel and body regions, the buried emitter region comprises the first doping type.

7. The floating gate transistor of claim 6 wherein the first doping type is N-type and the second doping type is P-type.

8. The floating gate transistor of claim 6 wherein the first doping type is P-type and the second doping type is N-type.

9. The floating gate transistor of claim 6 wherein the buried emitter region is coupled to a negative voltage source to emit electrons during a write operation of the transistor.

10. The floating gate transistor of claim 6 wherein the floating gate is electrically isolated from the channel by a high-k dielectric.

11. The floating gate transistor of claim 6 wherein the floating gate comprises at least one of a material having a lower work function than polysilicon, SiC, SiOC, GaN, GaAlN, or microcrystalline GeC.

12. The floating gate transistor of claim 6 further comprising a write conductor coupled to the buried emitter region to selectively program the floating gate transistor.

13. A flash memory device comprising:
  an array of floating gate transistors;
  control circuitry to write data to the floating gate memory cells during a write operation;
  bi-polar junctions located in the array of floating gate transistors to form vertical electric fields in the floating gate transistors during the write operation, such that electrons are accelerated in the vertical electric fields and injected onto the floating gates, wherein at least one of the bi-polar junctions includes a base region having a same and higher doping type than a body region; and
  bias conductors to selectively bias the bi-polar junctions to form the vertical electric field.

14. The flash memory of claim 13 wherein the bi-polar junctions comprise a plurality of buried implant regions located vertically below a channel region of each of the floating gate transistors.

15. The flash memory of claim 14 wherein the buried implant regions are N-type doped implants in a P-type substrate.

16. The flash memory of claim 15 wherein the control circuitry is coupled to the implant regions and the substrate.

17. The flash memory of claim 13 wherein the floating gate transistors are arranged in a NOR configuration to allow random access reads and writes.

18. The flash memory of claim 13 wherein the floating gates are electrically isolated by at least a dielectric having a dielectric constant greater than seven.

19. A floating gate transistor comprising:
  source and drain regions located in a transistor body region, the source and drain regions are laterally spaced apart to form a channel therebetween;
  a base region having a same and higher doping type than the transistor body region;
  a floating gate electrically isolated from and located vertically above the channel;
  a control gate isolated from and located vertically above the floating gate; and
  means for accelerating electrons for injection onto the floating gate during a write operation in response to a negative bias applied to a buried emitter region disposed in the transistor body region below the floating gate.

20. The floating gate transistor of claim 19, wherein the means for accelerating electrons includes a buried implant region.

21. The floating gate transistor of claim 19, wherein the means for accelerating electrons includes a bias conductor connected to the buried implant region to selectively form the vertical electric field.

22. The floating gate transistor of claim 21, wherein the floating gate is electrically isolated from the channel by a high-k dielectric.

23. The floating gate transistor of claim 22, wherein the floating gate comprises at least one of a group consisting essentially of a material having a lower work function than polysilicon, SiC, SiOC, GaN, GaAlN, and microcrystalline GeC.

* * * * *

UNITED STATES PATENT AND TRADEMARK OFFICE
CERTIFICATE OF CORRECTION

PATENT NO. : 7,372,098 B2  Page 1 of 1
APPLICATION NO. : 11/154462
DATED : May 13, 2008
INVENTOR(S) : Forbes It is certified that error appears in the above-identified patent and that said Letters Patent is hereby corrected as shown below:

Title Pg., Item (75), under "Inventor", column 1, line 1, delete "Corvalis" and insert -- Corvallis --, therefor.

Signed and Sealed this

Second Day of September, 2008

JON W. DUDAS
*Director of the United States Patent and Trademark Office*